United States Patent [19]

Seesink

[11] Patent Number: 5,546,031
[45] Date of Patent: Aug. 13, 1996

[54] FEED-BACK CIRCUIT FOR CMOS HIGH VOLTAGE GENERATOR TO PROGRAM (E) EPROM-MEMORY CELLS

[75] Inventor: Petrus H. Seesink, Eindhoven, Netherlands

[73] Assignee: Sierra Semiconductor B.V., 'S-Hertogenbosch, Netherlands

[21] Appl. No.: 256,447

[22] PCT Filed: Dec. 29, 1992

[86] PCT No.: PCT/NL92/00238

§ 371 Date: Oct. 11, 1994

§ 102(e) Date: Oct. 11, 1994

[87] PCT Pub. No.: WO93/14555

PCT Pub. Date: Jul. 22, 1993

[30] Foreign Application Priority Data

Jan. 14, 1992 [NL] Netherlands ............... 9200057

[51] Int. Cl.[6] .................................................. H03L 7/06
[52] U.S. Cl. ..................... 327/155; 327/157; 327/536
[58] Field of Search .................... 327/146, 147, 327/148, 149, 150, 155, 156, 157, 536; 331/74

[56] References Cited

U.S. PATENT DOCUMENTS

| | | | |
|---|---|---|---|
| 3,333,205 | 7/1967 | Featherston | 327/155 |
| 4,316,150 | 2/1982 | Crosby | 327/147 |
| 4,527,180 | 7/1985 | Oto. | |
| 5,334,953 | 8/1994 | Mijuskovic | 331/8 |

FOREIGN PATENT DOCUMENTS

| | | |
|---|---|---|
| 0323156 | 7/1989 | European Pat. Off. |
| 0328191 | 8/1989 | European Pat. Off. |
| 0350462 | 1/1990 | European Pat. Off. |
| 2035629 | 6/1980 | United Kingdom. |

Primary Examiner—Timothy P. Callahan
Assistant Examiner—Jung Ho Kim
Attorney, Agent, or Firm—Young & Thompson

[57] ABSTRACT

A feed-back circuit for a high voltage generator including several voltage multiplying stages connected in series, wherein an oscillator generates two clock pulses being 180° out of phase to one another, controlling alternately successive voltage multiplying stages to provide a high voltage pulse at the output of the high voltage generator, the high voltage output being connected to the feed-back circuit generating a control signal supplied to the oscillator, so that the two clock pulses are modified in dependence on the high voltage output voltage, wherein the feed-back circuit includes a high voltage feed-back circuit provided with a capacitive input stage (CP, CR), the output signal (VCTR-LHV) of the high voltage feed-back circuit controlling the current of a controlled current source, and at least the oscillator generating the clock pulses receives the current as control signal and in dependence thereon controls the frequency of the clock pulses.

13 Claims, 3 Drawing Sheets

FEED-BACK CIRCUIT FOR CMOS HIGH VOLTAGE GENERATOR TO PROGRAM (E) EPROM-MEMORY CELLS

The invention relates to a high voltage feed-back circuit for a high voltage generator comprising several voltage multiplying stages connected in series, wherein an oscillator generates at least two clock pulses being 180° out of phase to one another, controlling alternately successive voltage multiplying stages to provide a high voltage pulse at the output of the high voltage generator, the high voltage output being connected to the high voltage feed-back circuit comprising a capacitive input stage and generating a control signal supplied to the oscillator, so that the oscillator output is modified in dependence on the high voltage output voltage, said capacitive input stage comprising at least a first capacitor receiving at one terminal the high voltage output and its other terminal being connected to one terminal of a second capacitor.

Such a high voltage feed-back circuit is known from EP-A-0.323.156. Said known feed-back circuit is applied to a high voltage generator comprising a series connection of voltage multipliers being alternately controlled by clock signals Φ and Φ̄. The output voltage of this high voltage generator is capacitively measured and compared with a reference voltage by a comparator. The output signal of the comparator is supplied to a ring oscillator generating the clock signals Φ and Φ̄. When the measured high voltage exceeds a certain threshold level the output of the comparator becomes low and as a consequence the ring oscillator stops oscillating and, therefore, the generation of clock pulses is stopped. When the high voltage level decreases below said threshold level the output of the comparator becomes high restarting the ring oscillator and the generation of clock pulses.

The high voltage feed-back circuit as known shows many disadvantages, the most important being discontinuities in the derivative of the high voltage output of the high voltage generator to which the feed-back circuit is applied. This is caused by the application of the comparator in the feed-back circuit, the output of the comparator being only capable of starting or stopping the ring oscillator and, therefore, the multiplying stages in the high voltage generator suffer from sudden stops or starts in the receipt of controlling clock pulses. Such discontinuities in the derivative of the high voltage output reduces the lifetime of EEPROM cells. Moreover, the comparator in the known feed-back circuit must be rather fast. Otherwise the programming voltage will show too large overshoots and undershoots, which will also reduce the lifetime of the EEPROM cells as well as of the high voltage generator itself, because of break-down effects. However, a rather fast comparator consumes substantial power.

Furthermore, in EP-A-0.323.156 the reference voltage being supplied to the comparator is not constant, but is set to a low value before starting the generation of the programming pulse. During the generation of the programming pulse this reference voltage is increased proportional to the desired increase of the programming pulse. A complex network of capacitors and control circuitry is required to realise the slow increase of the reference voltage.

Another high voltage feed-back circuit used in a high voltage generator is known from U.S. Pat. No. 4.527.180. The output voltage of the high voltage generator is capacitively measured to generate a feedback signal. The feedback signal is supplied to one input of an operational amplifier, the other input of which receives a reference voltage. The output of the operational amplifier, being used as an comparator, supplies a driving signal to a driver stage in the high voltage generator. The reference voltage is not constant, but is set to a low value before the generation of a programming pulse by the high voltage generator. During the generation of the programming pulse the reference voltage is slowly increased proportional to the desired increase of the programming pulse. To realize a slow rise-time of the programming pulse in this way a rather complex circuitry is used. Moreover, an RC network is used to realize said slow rise-time. However, the high-ohmic resistor as used introduces an inaccuracy not desired.

The object of the present invention is to overcome the problems associated with the prior art as mentioned above.

Therefore, the feed-back circuit according to the invention is characterized in that the other terminal of the second capacitor is connected both to a point of common voltage through a first current source and to a first reference voltage through a first switch controlled by a control signal, the connecting point of the first and second capacitor being connected to a second reference voltage through a second switch controlled by the control signal, which connecting point provides the output signal of the high voltage feed-back circuit, which control signal only then brings the first and second switch into a conducting state when no programming pulse is to be generated.

In the feed-back circuit no comparator is used. An analog control circuit is used instead, by means of which the generation of discontinuities in the derivative of the output voltage of the high voltage generator can be avoided, thereby significantly improving the lifetime of EEPROM cells to be programmed. Besides, power consumption is reduced. No complex network of capacitors and control circuitry is required to realize a slow rise-time of the output of the high voltage generator. Here, a simple current source connected to the series connection of the first and second capacitors suffices.

In a preferred embodiment the junction of the first and second capacitor is connected to an amplifying unit, the output of which provides the output signal of the high voltage feed-back circuit. The amplifying unit preferably comprises an operational amplifier the output of which provides the output signal and is fed back to its inverting input through a third capacitor, which inverting input is also connected to the point of common voltage through a fourth capacitor, a third switch also controlled by the control signal being arranged parallel to the third capacitor and the non-inverting input being connected to the junction of the first and second capacitors. So, instead of the comparator of the prior art, an operational amplifier is used in a analog regulating circuit. It is, therefore, easily possible to amplify the control voltage, i.e. the voltage at the junction of the first and second capacitors, in a linear way. Furthermore the voltages at the inputs of the operational amplifier are almost constant which simplifies the common mode input range requirement of the regulator.

The invention will be hereinafter explained by reference to a drawing. In the drawing FIG. 1 shows an embodiment of a voltage multiplying circuit in which the feed-back circuit according to the invention may be applied;

Figure 1:
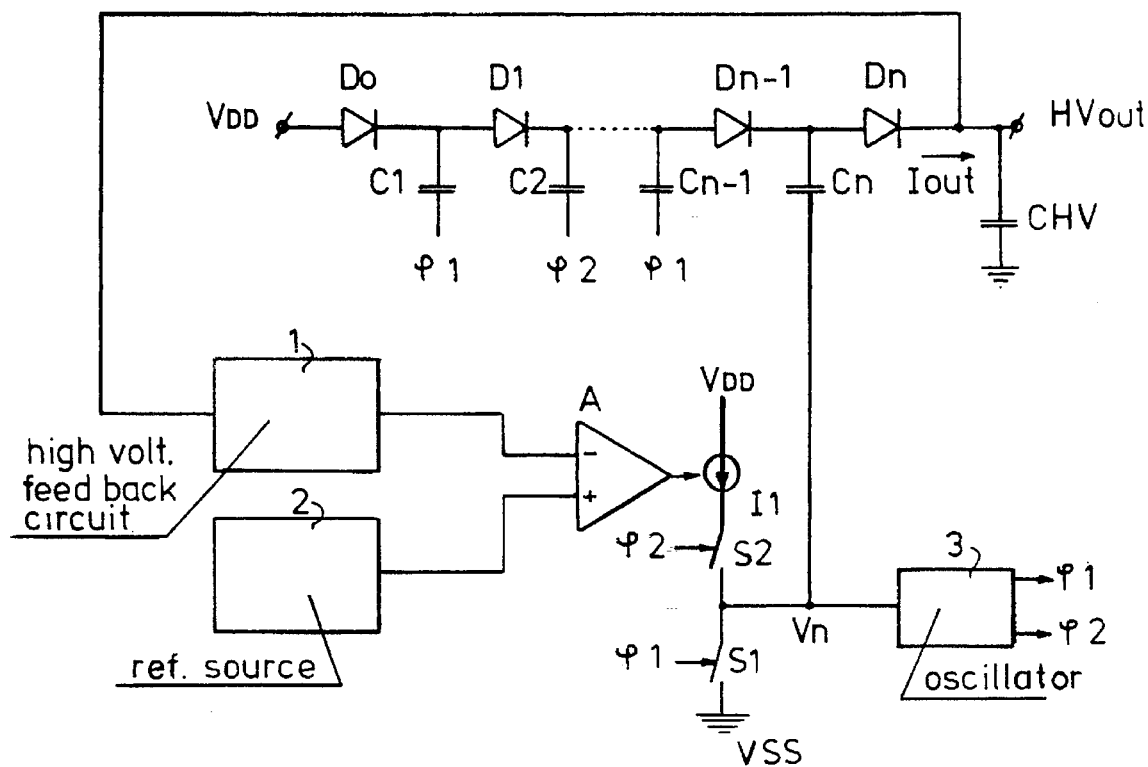

In FIG. 1 a possible application of the feed-back circuit according to the invention is shown. The figure shows a prior art voltage multiplier consisting of several charge pumps connected in series. Each charge pump comprises a diode Di and a capacitor Ci+1 connected to its cathode. At its other side each capacitor receives a clock pulse (Φ1 or Φ2) generated by an oscillator 3. The oscillator 3 generates two clock pulses being 180° out of phase to one another and being supplied alternately to the successive capacitors Ci. In this prior art voltage multiplier in each stage a voltage increase being at most equal to the step magnitude of the clock pulse less the threshold voltage of the diodes occurs. The diodes Do . . . Dn may be MOS-transistors connected as diodes.

Figure 5:
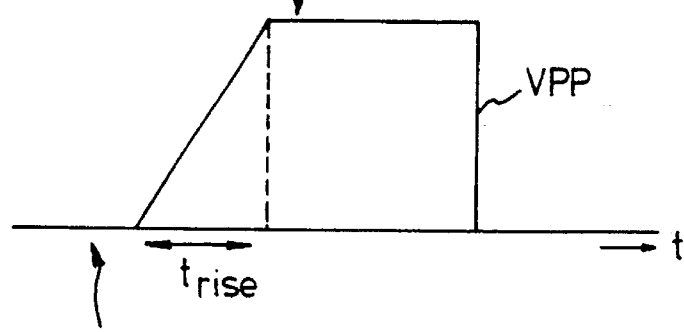
FIG. 5 shows a representation of a high voltage pulse capable to program a (E)EPROM-memory cell.

In the arrangement according to FIG. 1 the last capacitor Cn is not controlled by one of both clock pulses Φ1 or Φ2, but by a control current I1. This provides the possibility to reduce spikes on the high voltage output during switching of the clock pulses Φ1 and Φ2. Because the principle of current control of the last capacitor is described in copending U.S. patent application Ser. No. 08/256,511 (the content of which corresponds to published international patent application WO-A-93/14554) assigned to the assignee of the present patent application and the content of which is incorporated herein by way of reference. In the arrangement according to FIG. 1 reference number 1 refers to a high voltage feed-back circuit and reference number 2 refers to a reference source supplying a reference voltage to an amplifier A. Important to the present invention is that the amplifier A controls the magnitude of the current I1 and, therefore, among other things controls the oscillator 3, by means of which by modifying the frequency of the clock pulses Φ1 and Φ2 the rise time of the slope of the high voltage pulse VPP is determined. Reference is made to FIG. 5 which shows an example of the wave-form of a programming pulse VPP occurring at the high voltage output.

Application of the high voltage feed-back circuit 1 according to the invention is, however, not limited to the arrangement of FIG. 1; the feed-back circuit may also be applied in such cases where only a control current is supplied to the oscillator, by means of which the frequency of the clock pulse Φ1 and Φ2 is controlled and wherein the last capacitor of the voltage multiplying circuit also receives one of both clock pulses Φ1 and Φ2, and consequently the output of the high voltage generator is not current controlled.

Figure 2:
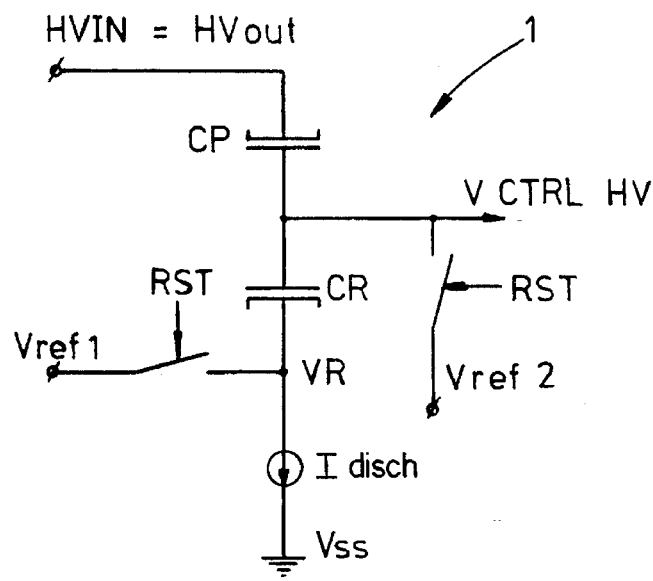
FIG. 2 shows a first embodiment of a high voltage feed-back circuit having a capacitive input stage.

FIG. 2 shows a high voltage feed-back circuit 1 having a capacitive input stage. The high voltage input HVIN which in case the high voltage feed-back circuit 1 is applied in the arrangement according to FIG. 1 equals output voltage HVout of the voltage multiplier, is supplied to a capacitor CP connected in series with a capacitor CR. The connecting point of both capacitors is connected to a reference voltage Vref2 through a switch controlled by a signal RST. RST is a pulse-shaped signal having the value "1" (high) when no high voltage pulse is to be generated and having the value "0" (low) when there is to be generated a programming pulse.

The other terminal of the capacitor CR is connected both to a reference voltage Vref1 through a switch also controlled by RST and to a point of common voltage VSS (ground) through a current source $I_{disch}$. As long as RST=1 both controlled switches are closed and the output voltage of the high voltage feed-back circuit VCTRLHV=Vref2. Vref2, therefore, determines the zero-level of the output of the feed-back circuit. The capacitors CP and CR, respectively, are then charged to a voltage $HVIN_{st}$-Vref2 and Vref1-Vref2, respectively. Here, $HVIN_{st}$ is the starting level of the programming pulse VPP at the high voltage generator (see FIG. 5). Mostly $HVIN_{st}$=VDD, where VDD is the positive supply voltage.

Figure 6:
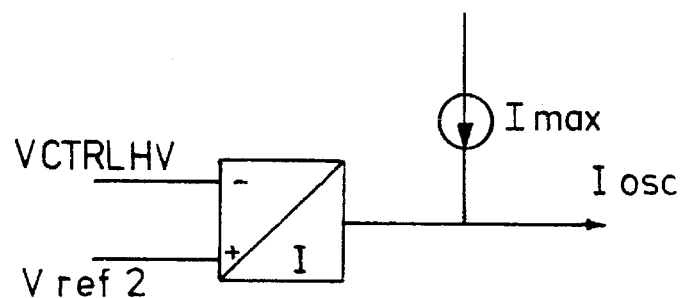
FIG. 6 shows a controlled current source being able to generate a control current to an oscillator.
Figure 7:
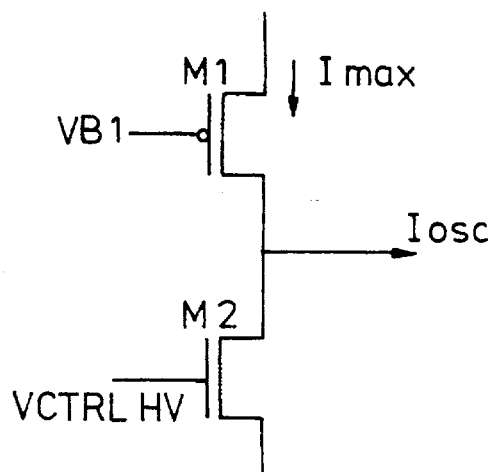
FIG. 7 shows a realization of the arrangement of FIG. 6 in CMOS-technology.

The output voltage VCTRLHV of the high voltage feed-back circuit, for example by means of an arrangement as shown in FIG. 6, is converted to a control current $I_{OSC}$ controlling the oscillator and controlling the frequency of the clock pulses Φ1 and Φ2. The voltage VCTRLHV, therefore, is compared to the reference voltage Vref2. In dependence on the result thereof part of the current $I_{max}$ (see FIG. 6) is led away and, therefore, the current $I_{OSC}$ is controlled. FIG. 7 shows an embodiment of the arrangement of FIG. 6 in CMOS-technology. In the arrangement of FIG. 7 the current $I_{max}$ is generated by means of a MOS-transistor M1, the gate electrode of which receives a predetermined voltage VB1. The current $I_{max}$ is partly led away from the output current $I_{OSC}$ through an other MOS-transistor M2, the gate electrode of which receives the voltage VCTRLHV. In this situation the threshold voltage of M2 has to be equal to Vref2. Then, $I_{OSC}$ then is controlled by the magnitude of VCTRLHV when it exceeds the magnitude Vref2.

When a programming pulse has to be generated RST becomes zero and both switches controlled by RST in FIG. 2 are opened. Consequently the magnitude of the voltage VR decreases, in dependence on the magnitude of $I_{disch}$. The magnitude of VCTRLHV, therefore, will only then retain the same value as the rising edge of the voltage HVIN (=VPP) rises with a value of CR/CP times the falling edge of VR. If VPP has a rise time of $t_{rise}$ then:

$$I_{disch}=Vref1*(CR/t_{rise}) \quad (1)$$

At the end of $t_{rise}$ VPP will reach a maximum value $VPP_{max}$. This value $VPP_{max}$ is determined by:

$$VPP_{max}=(CR/CP)*Vref1+HVIN_{st} \quad (2)$$

The magnitude of Vref1, therefore, determines the maximum value of the programing pulse.

Figure 3:
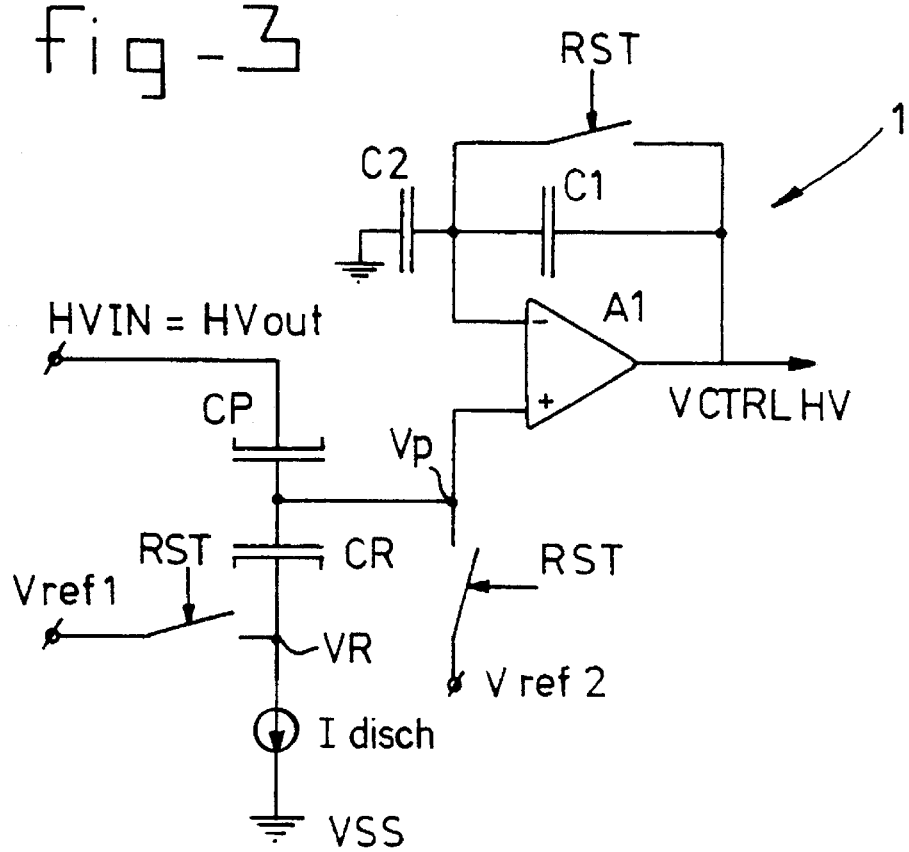
FIG. 3 shows a second embodiment of a high voltage feedback circuit having a capacitive input stage.

FIG. 3 shows a preferred embodiment of the high voltage feed-back circuit according to the invention. The capacitive input stage is identical to the one of FIG. 2. The output of the capacitive input stage, however, is amplified to generate the signal VCTRLHV. This amplification reduces the inaccuracy of the circuit caused by a (small) difference between Vref2 and the real threshold voltage of transistor M2 from FIG. 7. It is observed that the entire amplifying stage is, strictly spoken, not necessary when VCTRLHV is only loaded by a (small) capacitive load, as would be the case if the load would be transistor M2 from FIG. 7. The amplifying stage is exclusively utilized in the circuit to enhance the accuracy of the controller.

The amplifier comprises an operational amplifier A1 the output of which is fed back to its inverting input through a capacitor C1, said inverting input being also connected to ground (VSS) through a capacitor C2. A switch controlled by RST is connected parallel to C1. Before a programming pulse has to be generated RST=1 and C1 is discharged. Consequently, as in the circuit according to FIG. 2, then VCTRLHV=Vref2. When a programming pulse has to be generated all switches controlled by RST are opened and:

$$VCTRLHV=(C2/C1)*VP \quad (3)$$

where VP is the output voltage of the capacitive input stage. It is observed that a programming pulse generally lasts no longer than 20 ms. Therefore, the drift of the voltage VP at the non-inverting input of the operational amplifier A1, when the programming pulse has reached his maximum value $VPP_{max}$, is small enough not to interfere with the operation of the feed-back circuit. Consequently, the voltages at the capacitive junctions may be properly defined before starting a programming pulse.

The voltages at the inputs of operational amplifier A1 are both about equal to VCTRLHV. VCTRLHV is set to the reference voltage Vref2 before the start of the generation of the programming pulse by the high voltage generator. During the whole period of generation of the programming pulse the voltages at the inputs of the regulator are constant, i.e. equal to Vref2. This is possible, because capacitor CR is not directly connected to ground but to Vref1 just before the generation of the programming pulse, whereafter it is discharged slowly to ground by the current source $I_{disch}$. Any voltage can be chosen for Vref2, for example the threshold voltage of an NMOST. FIGS. 6 and 7 show how this can be used to realize a very simple controlled output current to drive a current controlled oscillator, while in copending United States patent application 08/256,511 referred to above it is described how this technique can be extended to control the output current of the series connection of charge pumps shown in FIG. 1, resulting in an extreme smooth and accurate programming voltage. This significantly increases the life time of the EEPROM cells to be programmed and that of the high voltage generator itself. Moreover, the control voltage present at the junction of the capacitors CP, CR can be easily amplified in a linear way. At last, since the voltages at the inputs of the operational amplifier A1 are almost constant, the common mode input range requirement of the regulator is simplified. The circuit according to FIG. 1, which combines the present feed-back circuits with the control circuit of copending U.S. patent application Ser. No. 08/256,511 referred to above dissipates extremely low power.

In an alternative arrangement, the high voltage feed-back circuit 1 controls the current $I_{OSC}$ of a controlled current source as shown in FIGS. 6 and 7, and the oscillator 3 generating the clock pulses ($\Phi1, \Phi2$) receives said current as control signal and in dependence thereon controls the frequency of the clock pulses ($\Phi1, \Phi2$).

Figure 4:
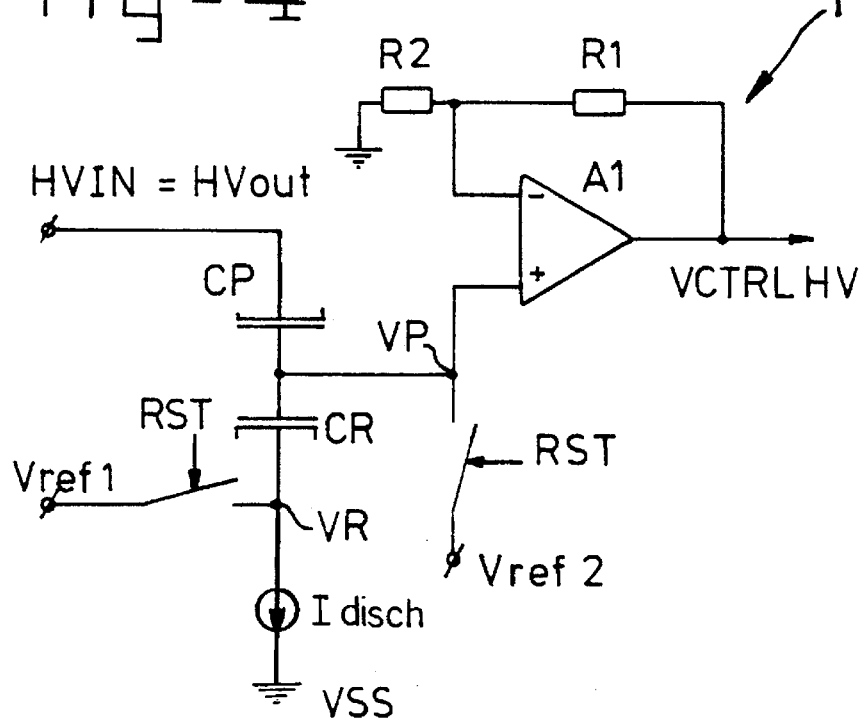
FIG. 4 shows a third embodiment of a high voltage feed-back circuit having a capacitive input stage.

It will be clear that the capacitors C1 and C2 in the amplifier part may be substituted by resistors R1 and R2, as shown in FIG. 4. The switch controlled by RST between the output and the inverting input of the operational amplifier may, then, be omitted.

I claim:

1. High voltage feed-back controlled generator comprising several voltage multiplying stages connected in series, wherein an oscillator (3) generates first and second clock pulses ($\Phi1, \Phi2$) being 180° out of phase to one another and having a predetermined frequency, controlling alternately successive voltage multiplying stages to provide a high voltage pulse at an output of the high voltage generator, said output of the high voltage generator being connected to a high voltage feed-back circuit (1) comprising a capacitive input stage (CP, CR) and controlling the oscillator (3), so that the oscillator (3) produces an output modified in dependence on the output of the high voltage generator, said capacitive input stage (CP, CR) comprising at least a first capacitor (CP) comprising a first terminal and a second terminal, the first terminal being connected to the output of the high voltage generator and the second terminal being connected to a first terminal of a second capacitor (CR) at a first junction, wherein the second capacitor (CR) comprises a second terminal connected both to a point of common voltage (VSS) through a first current source ($I_{disch}$) and to a first reference voltage (Vref1) through a first switch controlled by a control signal (RST), the first junction being connected to a second reference voltage (Vref2) through a second switch controlled by the control signal (RST), which junction provides an output signal (VCTRLHV) of the high voltage feed-back circuit, which control signal (RST) only then causes the first and second switches to be conductive when no programming pulse is to be generated.

2. High voltage feed-back controlled generator according to claim 1, wherein said first junction (VP) of the first and second capacitors (CP, CR) is connected to an amplifying unit.

3. High voltage feed-back controlled generator according to claim 2, wherein the amplifying unit comprises an operational amplifier (A1) having an output connected to an inverting input of the operational amplifier through a third capacitor (C1), which inverting input is also connected to the point of common voltage (VSS) through a fourth capacitor (C2), a third switch also controlled by the control signal (RST) being arranged parallel to the third capacitor and a non-inverting input of the operational amplifier being connected to the first junction (VP) of the first and second capacitors (CP, CR).

4. High voltage feedback controlled generator according to claim 1, wherein the output signal (VCTRLHV) of the high voltage feedback circuit controls a current ($I_{OSC}$) of a controlled current source, and at least the oscillator (3) generating the clock pulses receives said current ($I_{OSC}$) of said controlled current source which controls the predetermined frequency of said first and second clock pulses ($\Phi1, \Phi2$), the controlled current source comprising a current source of a predetermined current ($I_{max}$), which predetermined current ($I_{max}$) is divided into a first current branch and a second current branch, the first current branch conducting the current ($I_{OSC}$) of the controlled current source and the second current branch conducting a current determined by the output signal (VCTRLHV) of the high voltage feedback circuit.

5. High voltage feed-back controlled generator according to claim 4, wherein said controlled current source comprises a first MOS-transistor (M1) having a gate electrode which receives a predetermined voltage (VB1), and a second MOS-transistor (M2) having a gate electrode which receives the output signal (VCTRLHV) of the high voltage feed-back circuit, said first and second MOS transistors being connected at a second junction connected to said first current branch conducting said current ($I_{OSC}$).

6. High voltage feedback controlled generator according to claim 1, the high voltage generator comprising said several of voltage multiplying stages, each of said several of voltage multiplying stages comprising a capacitor and a diode, capacitors of successive multiplying stages receiving alternately one of said first or second clock pulses and the high voltage generator comprising a last voltage multiplying stage with a last capacitor which receives a control current determined by the high voltage feedback circuit instead of one of said first or second clock pulses.

7. A high voltage feedback controlled generator, said high voltage generator comprising:

a plurality of voltage multiplying stages connected in series to generate a high voltage pulse serving as an output of said high voltage generator;

an oscillator (3) generating two clock pulses ($\Phi1, \Phi2$) each having a same predetermined frequency, said two clock pulses being 180° out of phase with respect to each other;

wherein said two clock pulses are first and second control signals alternately supplied to successive voltage multiplying stages except a last voltage multiplying stage of said plurality of voltage multiplying stages;

a high voltage feedback circuit comprising:

a first capacitor (CP) and a second capacitor (CR) forming a capacitive input stage;

said first capacitor comprising a first terminal connected with said output of said high voltage generator and a second terminal connected with a first junction, said first junction supplying an output signal (VCTRLHV) of said high voltage feedback circuit;

said second capacitor comprising a first terminal connected with said first junction and a second terminal connected with a second junction;

a first switch controlled by a third control signal (RST), said first switch comprising a first terminal supplied with a first reference voltage and a second terminal connected with said second junction;

a first current source ($I_{disch}$) comprising a first terminal connected with said second junction and a second terminal connected to a point of common voltage (VSS);

a second switch controlled by said third control signal (RST), said second switch comprising a first terminal connected with said first junction and a second terminal supplied with a second reference voltage;

wherein said third control signal (RST) turns on said first switch and said second switch only when further generation of said high voltage pulse is not needed; and wherein said high voltage pulse is fed back to said capacitive input stage, thereby forming a feedback loop within said high voltage generator through said high voltage feedback circuit and said output signal (VCTRLHV) is supplied to an input stage of said oscillator (3); and wherein said oscillator (3) thereby modifies said two clock pulses based on said high voltage pulse of said high voltage feedback circuit.

8. A high voltage feed-back controlled generator according to claim 7, wherein said high voltage feed-back circuit is connected with an amplifying unit.

9. A high voltage feed-back controlled generator according to claim 8, wherein said amplifying unit comprises an operational amplifier (A1) having an inverting input terminal, a non-inverting input terminal and an amplifier output terminal;

a third capacitor (C1) having a first terminal connected with said inverting input terminal and a second terminal connected with said amplifier output terminal, thereby forming a feed-back loop;

a third switch controlled by said third control signal (RST), wherein said third switch is connected in parallel with said third capacitor;

a fourth capacitor (C2) having a first terminal connected with said inverting input terminal and a second terminal connected to said point of common voltage (VSS); and wherein said first junction (VP) of said high voltage feed-back circuit is connected with said non-inverting input terminal of said amplifying unit.

10. A high voltage feed-back controlled generator according to claim 7, further comprising:

a controlled current supply comprising a predetermined current source ($I_{max}$);

said controlled current supply comprising a first input terminal supplied with said output signal (VCTRLHV) of said high voltage feed-back circuit, a second input terminal supplied with said second reference voltage, a third input terminal supplied with said predetermined current source and a controlled current supply output terminal outputting a first current serving as an oscillator current, wherein said controlled current supply output terminal is connected with said input stage of said oscillator (3);

wherein said output signal of said high voltage feed-back circuit controls said oscillator current ($I_{OSC}$); and wherein said oscillator (3) modifies said two clock pulses based on said oscillator current.

11. A high voltage feed-back controlled generator according to claim 10, wherein said controlled current supply comprises:

a first MOS-transistor (M1);

a second MOS-transistor (M2);

said first MOS-transistor (M1) comprising a gate electrode receiving a predetermined voltage (VB1);

said second MOS-transistor (M2) comprising a gate electrode receiving said output signal (VCTRLHV) of said high voltage feed-back circuit;

wherein a source terminal of said first MOS-transistor (M1) and a drain terminal of said second MOS-transistor (M2) is connected at a third junction where said controlled current supply output terminal outputs said oscillator current ($I_{OSC}$).

12. A high voltage feed-back controlled generator according to claim 7, wherein each stage of said plurality of voltage multiplying stages comprises:

a capacitor;

a diode; and wherein said last voltage multiplying stage of said plurality of voltage multiplying stages receives a control current, wherein said control current is controlled by said high voltage feed-back circuit.

13. A high voltage feed-back controlled generator, comprising:

a plurality of voltage multiplying stages being connected in series;

an oscillator (3) generating two clock pulses ($\Phi 1, \Phi 2$) that are 180° out of phase with respect to each other and said two clock pulses having a same predetermined frequency;

said two clock pulses controlling alternately successive voltage multiplying stages of said plurality of voltage multiplying stages to generate a high voltage pulse at an output of the high voltage generator;

said output of the high voltage generator being fed back to a capacitive input stage (CP, CR) of a high voltage feed-back circuit (1), to thereby form a feedback loop between said high voltage generator and said high voltage feed-back circuit;

wherein said high voltage feed-back circuit (1) comprises said capacitive input stage (CP, CR) and generates an oscillator (3) control signal to be supplied to an input stage of the oscillator (3), said oscillator (3) thereby modifies said two clock pulses based on the output of the high voltage generator;

said capacitive input stage (CP, CR) comprises a first capacitor having a first terminal and a second terminal, the first terminal being connected to the output of the high voltage generator and the second terminal being connected to a first terminal of a second capacitor at a first junction;

wherein the second capacitor (CR) comprises a second terminal connected both to a point of common voltage (VSS) through a first current source ($I_{disch}$) and to a first reference voltage (Vref1) through a first switch that is controlled by a control signal (RST);

said first junction being connected to a second reference voltage (Vref2) through a second switch that is controlled by the control signal (RST);

said first junction provides an output signal (VCTRLHV) of the high voltage feed-back circuit to said input stage of oscillator (3);

said control signal (RST) only turns on said first and second switches when generation of said high voltage is not needed.

* * * * *